United States Patent [19]

Conzelmann et al.

[11] Patent Number: 4,942,308
[45] Date of Patent: Jul. 17, 1990

[54] POWER TRANSISTOR MONOLITHIC INTEGRATED STRUCTURE

[75] Inventors: Gerhard Conzelmann, Leinfelden-Oberaichen; Karl Nagel, Gomaringen; Gerhard Fiedler, Neckartailfingen, all of Fed. Rep. of Germany

[73] Assignee: Robert Bosch GmbH, Stuttgart, Fed. Rep. of Germany

[21] Appl. No.: 301,821

[22] Filed: Jan. 25, 1989

[30] Foreign Application Priority Data

Jan. 30, 1988 [DE] Fed. Rep. of Germany ....... 3802794

[51] Int. Cl.[5] .................... H03K 17/60; H01L 27/082
[52] U.S. Cl. .................... 307/202.1; 357/51; 365/225.7
[58] Field of Search .................... 307/202.1; 357/51; 365/225.7

[56] References Cited

U.S. PATENT DOCUMENTS

| | | | |
|---|---|---|---|
| 4,038,677 | 7/1977 | Nagel et al. | 357/51 |
| 4,689,494 | 8/1987 | Chen et al. | 307/202.1 |
| 4,785,199 | 11/1988 | Kolodny et al. | 307/202.1 |

*Primary Examiner*—John S. Heyman
*Attorney, Agent, or Firm*—Michael J. Striker

[57] ABSTRACT

A power transistor monolithic integrated structure produced by a bipolar-epitaxial technology includes a plurality of parallel connected transistor cellular structures each containing at least one component transistor. The base of each component transistor is coupled to a common base control conductor via a protective resistor and a fuse link which melts in the event of a defect in the transistor cell. Another fuse link is incorporated in the branch conductors leading from the collectors of respective component transistor to a common conductor web mounted on the surface of the transistor chip. All transistor cellular structures are electrically isolated one from each other during the manufacturing process.

6 Claims, 1 Drawing Sheet

POWER TRANSISTOR MONOLITHIC INTEGRATED STRUCTURE

BACKGROUND OF THE INVENTION

The present invention relates to a power transistor monolithic integrated structure produced in a bipolarepitaxial technology and including a plurality of parallel connected transistor cellular structures each containing at least one component transistor.

From the U.S. Pat. No. 4,038,677 a power transistor monolithic integrated structure of this kind is known in which protective fuse links are connected both in the emitter—and in the base conductors of respective component transistors. With the aid of the fuse links which act simultaneously as measuring resistors, a possibility has been created in this known power transistor to recognize defects in the component transistors which may occur during the manufacturing process. By a voltage shock applied to the component transistors the fuse links of defective component transistors melt or burn up thus separating the circuit of defective transistors from the intact parts of the power transistor.

SUMMARY OF THE INVENTION

An object of the present invention is to provide a power transistor monolithic integrated structure of the above described type wherein the power transistor is self-healing, that means if a defect in a component transistor or in a transistor cellular structure occurs, the defective component transistor or transistor structure is separated automatically from the remaining functional parts of the power transistor.

In keeping with these objects and others which will become apparent hereafter, one feature of this invention resides in the power transistor of the above described kind, in the provision of transistor cellular structures which are electrically insulated one from each other and each including transistor electrode terminals, a conductor web leading to an external collector terminal of the power transistor, means for connecting collector terminals of the transistor cell structures to the conductor web, the connecting means including a plurality of branch conductors for connecting the collector terminals to outwardly directed connection spots of the conductor web, and each of the branch conductors being provided with a fuse link dimensioned such as to melt when a defect occurs in the associated transistor cell structure thereby to disconnect the defective component transistor.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Power transistor monolithic integrated structures require a high power density per a surface unit in order to be cost effectively manufactured. A high power density per a unit area is achievable for example by soldering the transistor chip on a copper mounting plate. Due to the fact that in a mass production it is not always possible to bond or solder absolutely without the formation of shrink holes and during the final quality control reliably detect the production pieces having fine shrink holes, it is unconditionally necessary to provide transistor structures having a "selfhealing" effect in order to achieve a high reliability of such power transistors. It has been already devised to isolate collectors of the individual transistor cell structures one from each other and to create a narrow region in the respective collector conductors leading to a connection spot of the common conductor web. If a portion of a transistor cell or of a plurality of transistor cells is heated due to an underlying shrink hole, it becomes conductive and passes through almost the entire amount of available current. As a consequence the narrow region or regions in the conductor burns up and the transistor cell containing the defective component transistor is separated from the remaining sound part of the power transistor. Since the melted piece of the defective transistor cell does not take away any base current from the rest of the power transistor the control current is supplied in the simplest case through resistance between the base conductors and a conductor for an operational voltage.

Figure 1:
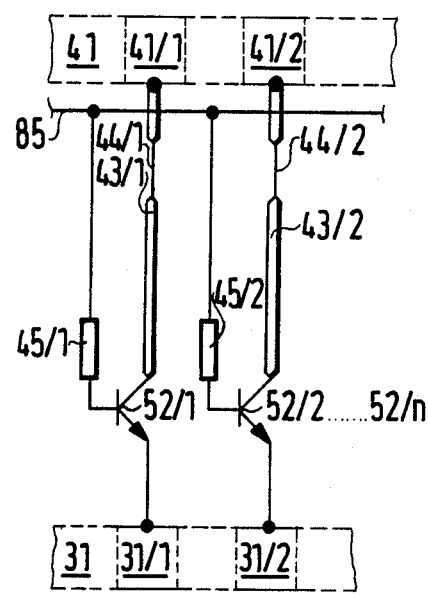
FIGS. 1 through 4 illustrate schematic circuit diagrams of different embodiments of this invention.

Referring to FIG. 1, reference numeral 31 denotes a common conductor web for emitter electrodes of respective transistor cells of the power transistor whereby individual connection spots 31/1, 31/2 and so on for respective cell emitters are directed outwardly to the outer surface of the chip where the common emitter conductor web is mounted. Similarly, the reference numeral 41 indicates a common conductor web for the collector electrodes of respective transistor cells which are also connected to corresponding connection spots 41/1, 41/2 and so on leading outwards where the common collector conductor web is mounted and leading to a collector electrode external to the transistor chip. The illustrated two transistor cells each containing a transistor 52/1 or 52/2 continue in the same parallel connected circuit arrangement to the right up to the last transistor cell 52/n. The collector electrode of each transistor cell is connected via conductors 43/1, 43/2 and so on to discrete external connection spots 41/1, 41/2 and so on connected to the common collector conductor web 41. The branch collector conductors 43/1, 43/2 and so on include fuse links 44/1, 44/2 and so on, respectively. The conductor 85 is the common conductor for distributing the base control voltage of the power transistor. Between the common conductor 85 and the bases of respective component transistors of the cells there are connected decoupling resistors 45/1, 45/2 and so on. These resistors restrict the flow of base current from the common control conductor 85 via a defective base-emitter path to the minus pole at the emitter common conductor web 31.

Figure 2:
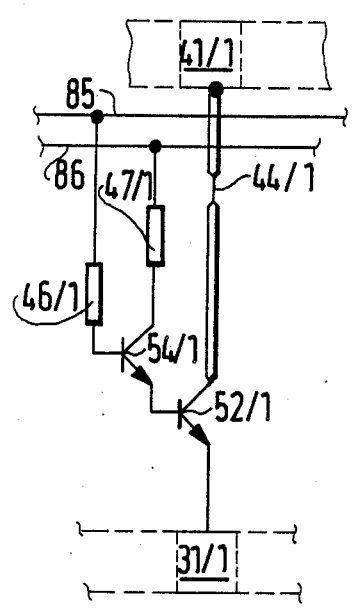

The embodiment of FIG. 2 illustrates a single transistor cell having two component transistors including a driver transistor 54/1. The resistor 47/1 is a collector resistor for the driver transistor connected to a common conductor line 86 for distributing operating voltage for the driving transistors, and resistor 46/1 serves for coupling the base of driver transistor to the common control line 85. The latter resistor could be replaced if desired by another resistor connected between the emitter and the base electrodes of the power transistor 52/1.

Similarly as in the preceding embodiment, the fuse link 44/1 is connected in the collector branch conduit of the cell output transistor 52/1.

Figure 3:
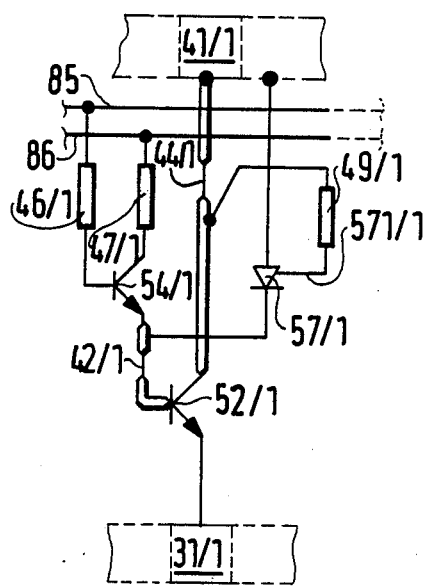

In the embodiment of FIG. 3 there is provided a fuse link 42/1 in the connection between the emitter of the drive transistor 54/1 and the cell output transistor 52/1. The fuse link 42/1 serves for the separation of a defective base-emitter path of the transistor 52/1. In addition, there is provided a controlled switching element 57/1 in the form of a thyristor whose anode is connected to the common collector conductor web 41 and its cathode is connected to the emitter electrode of the drive transistor 54/1 above the fuse link 42/1. The gate electrode 571/1 of the thyristor is connected via a resistor 49/1 to the collector of the transistor 52/1. If the latter component transistor is defective the fuse link 44/1 burns up or melts when the collector potential is applied to the emitter potential. The thyristor 57/1 triggers (provided that the composite power transistor is operating outside its saturation). Consequently, the fuse link 42/1 also burns up and short circuited base-emitter path is separated.

Figure 4:
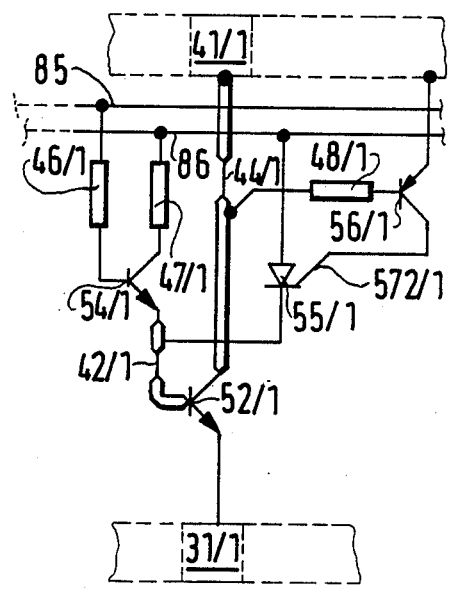

In the embodiment of FIG. 4 the anode of thyristor 55/1 is connected to the common line 86 for the collector operating voltage, and its cathode is again connected to the end of fuse link 42/1 which is remote from the base of transistor 52/1. The gate electrode 572/1 in this case controls the cathode and is connected to the collector of a pnp-transistor 56/1 whose emitter is connected to the common collector conductor web 41 and its base is connected via resistor 48/1 with the collector of the component resistor 52/1. The triggering condition of the thyristor 55/1 corresponds to that of the thyristor 57/1 in FIG. 3. The resistors 46/1 in the embodiments of FIGS. 3 and 4 do not serve for decoupling the control voltage but serve for preventing damage of base-emitter path of the driver transistor 54/1 when the fuse links 42/1 burn up. For operation, these resistors are not indispensable.

On the first sight it may seem as disadvantageous to provide fuse links in the branch conductors for cell collectors inasmuch as the individual transistor cells must be electrically isolated one from the other. However, in power transistors of a high consumption this is no disadvantage because the area of its chip is determined in dependency on the power loss and therefore the mutual isolation of respective transistor cells is of no consequence for the size of the chip surface. Due to the mutual isolation of the transistor cells there result other degrees of freedom for the application of power transistor fabricated in this manner.

While the invention has been illustrated and described as embodied in specific examples of a bipolar, monolithic integrated power transistor circuit, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A bipolar power transistor monolithic integrated structure made by epitaxial technology, comprising a plurality of parallel connected transistor cells each containing at least one component transistor and transistor electrode terminals, said transistor cells being electrically isolated one from each other; a conductor web leading to an external collector terminal of the power transistor structure; means for connecting collector terminals of said transistor cells to said collector conductor web, said connecting means including a plurality of branch conductors for connecting said collector terminals of the transistor cells to external connection spots connected to said conductor web, each of said branch conductors being provided with a fuse link dimensioned such as to melt when a defect occurs in the associated transistor cell and thereby to separate the defective component transistor; a common cell base control conductor, the base of said at least one component conductor in respective cells being coupled to said common base control conductor via an additional fuse link to disconnect in the event of a defect the base control conductor from the component transistor; and a plurality of electronic controlled switches connected between said common conductor web and the ends of respective additional fuse links remote from the base of the component transistor in respective transistor cells, each of said switches having a control electrode coupled to the collector of the assigned component transistor.

2. A power transistor structure as defined in claim 1, wherein said controlled switches are semiconductive thyristors.

3. A bipolar power transistor monolithic integrated structure made by epitaxial technology, comprising a plurality of parallel connected transistor cells each containing at least one component transistor and transistor electrode terminals, said transistor cells being electrically isolated one from each other; a conductor web leading to an external collector terminal of the power transistor structure; means for connecting collector terminals of said transistor cells to said collector conductor web, said connecting means including a plurality of branch conductors for connecting said collector terminals of the transistor cells to external connection spots connected to said conductor web, each of said branch conductors being provided with a fuse link dimensioned such as to melt when a defect occurs in the associated transistor cell and thereby to separate the defective component transistor; a common cell base control conductor, the base of said at least one component conductor in respective cells being coupled to said common base control conductor via an additional fuse link to disconnect in the event of a defect the base control conductor from the component transistor; and a common operational voltage conductor; a plurality of electronic controlled switches connected between said operational voltage conductor and the ends of said additional fuse link in respective transistor cells remote from the base of the associated component transistor, each of said switches having a control electrode coupled to the collector of the component transistor to trigger the switch in response to a potential difference between the collector electrode of a defective transistor cell and the operational voltage for the collectors of intact cells.

4. A bipolar power transistor monolithic integrated structure made by epitaxial technology, comprising a plurality of parallel connected transistor cells each containing at least one component transistor and transistor electrode terminals, said transistor cells being electrically isolated one from each other; a conductor web leading to an external collector terminal of the power transistor structure; means for connecting collector terminals of said transistor cells to said collector conductor web, said connecting means including a plurality of branch conductors for connecting said collector terminals of the transistor cells to external connection spots connected to said conductor web, each of said branch conductors being provided with a fuse link dimensioned such as to melt when a defect occurs in the associated transistor cell and thereby to separate the defective component transistor; a common cell base control conductor, the base of said at least one component conductor in respective cells being coupled to said common base control conductor via an additional fuse link to disconnect in the event of a defect the base control conductor from the component transistor; and a common operational voltage conductor, each of said transistor cells including a driver transistor whose base is coupled via a coupling resistor to said common base controlled conductor and whose collector is coupled via a resistor to said operational voltage conductor, and whose emitter is coupled to said additional fuse link, said resistors being dimensioned for preventing damage of said driver transistor in the event of melting of said additional fuse link.

5. A bipolar power transistor monolithic integrated structure made by epitaxial technology, comprising a plurality of parallel connected transistor cells each containing at least one component transistor and transistor electrode terminals, said transistor cells being electrically isolated one from each other; a conductor web leading to an external collector terminal of the power transistor structure; means for connecting collector terminals of said transistor cells to said collector conductor web, said connecting means including a plurality of branch conductors for connecting said collector terminals of the transistor cells to external connection spots connected to said conductor web, each of said branch conductors being provided with a fuse link dimensioned such as to melt when a defect occurs in the associated transistor cell and thereby to separate the defective component transistor; each of said transistor cells including a driver transistor having an emitter coupled to the base of said component transistor, and a base coupled to a common base control conductor via a coupling resistor, and said coupling resistor being dimensioned for decoupling a short circuited base-emittor path of the component transistor in the event of its defect when the fuse link in the collector branch conductor burns up.

6. A power transistor structure as defined in claim 5, wherein the collectors of respective driver transistors are coupled to a common operational voltage conductor.

* * * * *